US012764969B2

(12) United States Patent
Ha

(10) Patent No.: US 12,764,969 B2
(45) Date of Patent: Oct. 13, 2026

(54) SEMICONDUCTOR DEVICE INCLUDING ALTERNATELY ARRANGED MEMORY CELLS HAVING REVERSED STACKING ORDERS AND METHOD FOR FABRICATING THE SAME

(71) Applicant: SK hynix Inc., Icheon-si (KR)

(72) Inventor: Tae Jung Ha, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 525 days.

(21) Appl. No.: 18/315,149

(22) Filed: May 10, 2023

(65) Prior Publication Data

US 2024/0172452 A1 May 23, 2024

(30) Foreign Application Priority Data

Nov. 21, 2022 (KR) ........................ 10-2022-0156444

(51) Int. Cl.
*H10B 61/00* (2023.01)
*H10N 50/01* (2023.01)
*H10N 50/80* (2023.01)

(52) U.S. Cl.
CPC ............. *H10B 61/00* (2023.02); *H10N 50/01* (2023.02); *H10N 50/80* (2023.02)

(58) Field of Classification Search
CPC ......... H10N 50/80; H10N 50/01; H10B 61/00
USPC .......................................................... 257/421
See application file for complete search history.

(56) References Cited

U.S. PATENT DOCUMENTS

| | | | | |
|---|---|---|---|---|
| 9,716,129 | B1 | 7/2017 | Sim et al. | |
| 2011/0157960 | A1* | 6/2011 | Kawamura | G11C 13/004 365/175 |
| 2019/0288038 | A1* | 9/2019 | Song | H10N 70/8413 |
| 2019/0341547 | A1* | 11/2019 | Song | H10B 61/10 |
| 2023/0131200 | A1* | 4/2023 | Ha | H10N 70/25 257/4 |
| 2023/0133638 | A1* | 5/2023 | Ha | H10B 61/10 438/382 |

* cited by examiner

*Primary Examiner* — Jami Valentine Miller
(74) *Attorney, Agent, or Firm* — Ashurst Perkins Coie US LLP

(57) ABSTRACT

A semiconductor device may include: first conductive lines extending in a first direction; second conductive lines extending a second direction crossing the first direction; a plurality of first memory cells disposed at first intersections of the first conductive lines and the second conductive lines, respectively, each first memory cell including a first memory layer and a first selector layer that is disposed over the first memory layer; and a plurality of second memory cells disposed at second intersections of the first conductive lines and the second conductive lines, each second memory cell including a second selector layer and a second memory layer that is disposed over the second selector layer, wherein each of the first memory cells and each of the second memory cells are alternately disposed along the first direction and the second direction.

11 Claims, 12 Drawing Sheets

SEMICONDUCTOR DEVICE INCLUDING ALTERNATELY ARRANGED MEMORY CELLS HAVING REVERSED STACKING ORDERS AND METHOD FOR FABRICATING THE SAME

PRIORITY CLAIM AND CROSS-REFERENCE TO RELATED APPLICATION

This patent document claims the priority and benefits of Korean Patent Application No. 10-2022-0156444 filed on Nov. 21, 2022, which is incorporated herein by reference in its entirety.

TECHNICAL FIELD

This patent document relates to memory circuits or devices and their applications in semiconductor devices or systems.

BACKGROUND

The recent trend toward miniaturization, low power consumption, high performance, and multi-functionality in the electrical and electronics industry has compelled the semiconductor manufacturers to focus on high-performance, high capacity semiconductor devices. Examples of such high-performance, high capacity semiconductor devices include memory devices that can store data by switching between different resistance states according to an applied voltage or current. The semiconductor devices may include an RRAM (resistive random access memory), a PRAM (phase change random access memory), an FRAM (ferroelectric random access memory), an MRAM (magnetic random access memory), and an electronic fuse (E-fuse).

SUMMARY

The disclosed technology in this patent document relates to memory circuits or devices and their applications in semiconductor devices or systems. Various implementations of a semiconductor device can improve the performance of a semiconductor device and reduce manufacturing defects.

In one aspect, a semiconductor device for implementing the disclosed technology may include: first conductive lines extending in a first direction; second conductive lines disposed over the first conductive lines to be spaced apart from the first conductive lines and extending a second direction crossing the first direction; a plurality of first memory cells disposed at first intersections of the first conductive lines and the second conductive lines, respectively, each first memory cell including a first memory layer and a first selector layer that is disposed over the first memory layer; and a plurality of second memory cells disposed at second intersections of the first conductive lines and the second conductive lines, each second memory cell including a second selector layer and a second memory layer that is disposed over the second selector layer, wherein each of the first memory cells and each of the second memory cells are alternately disposed along the first direction and the second direction.

In another aspect, a method for fabricating a semiconductor device for implementing the disclosed technology may include: forming first conductive lines extending in a first direction over a substrate; forming a first memory layer over the first conductive lines; forming, over the first memory layer, a first spacer layer extending in a third direction having a first angle tilted with respect to a second direction crossing the first direction; forming, over the first spacer layer, a second spacer layer extending in a fourth direction crossing the third direction; etching the first memory layer using a spacer pattern including a stacked structure of the first spacer layer and the second spacer layer as an etch barrier to form a first memory layer pattern over a first portion of each of the first conductive lines; conformally forming a selector layer to cover a top surface and sidewalls of the first memory layer pattern and have a hole disposed between adjacent first memory layers to be spaced apart from a top surface of a second portion of each of the first conductive lines; filling the hole with a second memory layer to form a second memory layer pattern; and forming second conductive lines extending in the second direction over the second memory layer pattern.

The above and other aspects of the disclosed technology are disclosed in the drawings, the detailed description and the claims.

DETAILED DESCRIPTION

Figure 1:
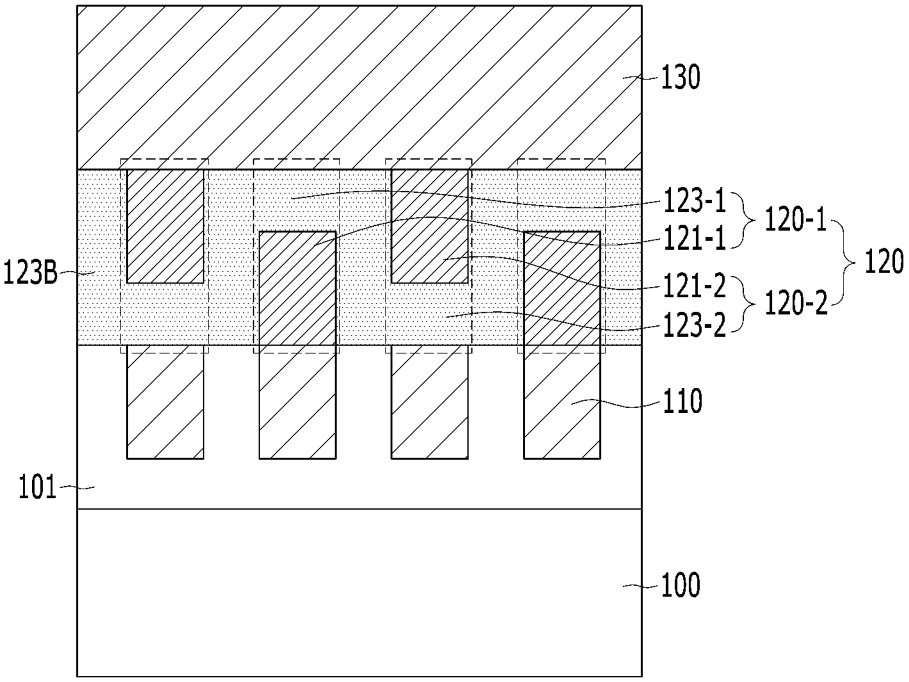
FIG. 1 illustrates an example of a semiconductor device based on some implementations of the disclosed technology.

Hereinafter, various embodiments of the disclosure will be described in detail with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 illustrates a semiconductor device based on some implementations of the disclosed technology.

Referring to FIGS. 1, the semiconductor device may include a substrate 100, first conductive lines 110 formed over the substrate 100 and extending in a first direction, second conductive lines 130 formed over the first conductive lines 110 to be spaced apart from the first conductive lines 110 and extending in a second direction different from or crossing the first direction, and memory cells 120 disposed at intersections of the first conductive lines 110 and the second conductive lines 130 between the first conductive lines 110 and the second conductive lines 130. The semiconductor device may have a cross-point structure where a memory cell resides at every intersection of the first conductive lines and the second conductive lines. In this patent document, the conductive lines can indicate conductive structures that electrically connect two or more circuit elements in the semiconductor memory. In some implementations, the conductive lines include word lines that are used to control access to memory cells in the memory device and bit lines that are used to read out information stored in the memory cells. In some implementations, the conductive lines include interconnects that carry signals between different circuit elements in the semiconductor memory.

The substrate 100 may include a semiconductor material such as silicon. A required lower structure (not shown) may be formed in the substrate 100. For example, the substrate 100 may include a driving circuit (not shown) electrically connected to the first conductive lines 110 and/or the second conductive lines 130 to control operations of the memory cells 120. In this patent document, the conductive lines can indicate conductive structures that electrically connect two or more circuit elements in the semiconductor device. In some implementations, the conductive lines include word lines that are used to control access to memory cells in the memory device and bit lines that are used to read out information stored in the memory cells. In some implementations, the conductive lines include interconnects that carry signals between different circuit elements in the semiconductor device.

The first conductive lines 110 and the second conductive lines 130 may be connected to a lower end and an upper end of the memory cell 120, respectively, and may provide a voltage or a current to the memory cell 120 to drive the memory cell 120. When the first conductive lines 110 functions as a word line, the second conductive lines 130 may function as a bit line. Conversely, when the first conductive lines 110 functions as a bit line, the second conductive lines 130 may function as a word line. The first conductive lines 110 and the second conductive lines 130 may include a single-layered structure or a multi-layered structure including one or more of various conductive materials. Examples of the conductive materials may include a metal, a metal nitride, or a conductive carbon material, or a combination thereof, but are not limited thereto. For example, the first conductive lines 110 and the second conductive lines 130 may include tungsten (W), titanium (Ti), tantalum (Ta), platinum (Pt), aluminum (Al), copper (Cu), zinc (Zn), nickel (Ni), cobalt (Co), lead (Pb), tungsten nitride (WN), tungsten silicide (WSi), titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), carbon (C), silicon carbide (SiC), or silicon carbon nitride (SiCN), or a combination thereof.

The memory cell 120 may be arranged in a matrix having rows and columns along the first direction and the second direction so as to overlap the intersection regions of the first conductive lines 110 and the second conductive lines 130.

The memory cell 120 may include a first memory cell 120-1 and a second memory cell 120-2 which are alternately disposed adjacent to each other along a first direction and a second direction. Thus, the first memory cell 120-1 and the second memory cell 120-2 may be alternately disposed along the first direction and the second direction. The first memory cell 120-1 may include a structure in which a first memory layer 121-1 and a first selector layer 123-1 are sequentially stacked, and the second memory cell 120-2 may include a structure in which a second selector layer 123-2 and a second memory layer 121-2 are sequentially stacked. The relative position of the first selector layer 123-1 and the first memory layer 121-1 and the relative position of the second selector layer 123-2 and the second memory layer 121-2 may be reversed. In the first memory cell 120-1, the first memory layer 121-1 is disposed at a lower portion of the first memory cell 120-1 and the first selector layer 123-1 is disposed at an upper portion of the first memory cell 120-1. In the second memory cell 120-2, the second selector layer 123-2 is disposed at a lower portion of the second memory cell 120-2 and the second memory layer 121-2 is disposed at an upper portion of the second memory cell 120-2.

In some implementations, the first memory layer 121-1 may be disposed between the first conductive lines 110 and the first selector layer 123-1 and the second memory layer 121-2 may be disposed between the second selector layer 123-2 and the second conductive lines 130.

The first memory layer 121-1 and the second memory layer 121-2 may include the same material and exhibit same function. The first memory layer 121-1 and the second memory layer 121-2 may be formed by different methods as will be discussed in more detail with reference to FIGS. 2A to 12B. In addition, the relative position of the first memory layer 121-1 and the first selector layer 123-1 may be different from the relative position of the second memory layer 121-2 and the second selector layer 123-2. In the description below, the first memory layer 121-1 and the second memory layer 121-2 may be collectively referred to as the memory layers 121-1 and 121-2.

In some implementations, the first selector layer 123-1 may be disposed between the first memory layer 121-1 and the second conductive lines 130, and the second selector layer 123-2 may be disposed between the first conductive lines 110 and the second memory layer 121-2. In the specification, the first selector layer 123-1 and the second selector layer 123-2 may be collectively referred to as the selector layers 123-1 and 123-2.

The memory layers 121-1 and 121-2 may be used to store data by representing stored data using different resistance states and by switching between different resistance states according to an applied voltage or current. The memory layers 121-1 and 121-2 may have a single-layered structure or a multi-layered structure including at least one of materials having a variable resistance characteristic used for an RRAM, a PRAM, an MRAM, an FRAM, and/or others. For example, the memory layers 121-1 and 121-2 may include a metal oxide such as a transition metal oxide or a perovskite-based oxide, a phase change material such as a chalcogenide-based material, a ferromagnetic material, a ferroelectric material, or others. In some implementations, the memory layers 121-1 and 121-2 may include a magnetic tunnel junction (MTJ) structure. However, the implementations are not limited thereto. For example, the memory cell 120 may include memory layers other than the memory layers 121-1 and 121-2 as long as they are capable of storing data.

In some implementations, the memory layers 121-1 and 121-2 may include an MTJ structure including a free layer having a variable magnetization direction, a pinned layer having a pinned magnetization direction and a tunnel barrier layer interposed between the free layer and the pinned layer.

The free layer may have one of different magnetization directions or one of different spin directions of electrons to switch the polarity of the free layer in the MTJ structure, resulting in changes in resistance value. In some implementations, the polarity of the free layer is changed or flipped upon application of a voltage or current signal (e.g., a driving current above a certain threshold) to the MTJ structure. With the polarity changes of the free layer, the free layer and the pinned layer have different magnetization directions or different spin directions of electron, which allows the memory layers 121-1 and 121-2 to store different data or represent different data bits. The free layer may also be referred as a storage layer. The magnetization direction of the free layer may be substantially perpendicular to a surface of the free layer, the tunnel barrier layer and the pinned layer. In other words, the magnetization direction of the free layer may be substantially parallel to stacking directions of the free layer, the tunnel barrier layer and the pinned layer. Therefore, the magnetization direction of the free layer may be changed between a downward direction and an upward direction. The change in the magnetization direction of the free layer may be induced by a spin transfer torque generated by an applied current or voltage.

The pinned layer may have a pinned magnetization direction, which remains unchanged while the magnetization direction of the free layer changes. The pinned layer may be referred to as a reference layer. In some implementations, the magnetization direction of the pinned layer may be pinned in a downward direction. In some implementations, the magnetization direction of the pinned layer may be pinned in an upward direction.

The free layer and the pinned layer may have a single-layered structure or a multi-layered structure including a ferromagnetic material. For example, the pinned layer may include an alloy based on Fe, Ni or Co, for example, an Fe—Pt alloy, an Fe—Pd alloy, a Co—Pd alloy, a Co—Pt alloy, a Co—Fe alloy, an Fe—Ni—Pt alloy, a Co—Fe—Pt alloy, a Co—Ni—Pt alloy, or a Co—Fe—B alloy, or may include a stack of metals, such as Co/Pt, or Co/Pd or others.

The tunnel barrier layer may allow the tunneling of electrons in both data reading and data writing operations. The tunnel barrier layer may include a dielectric oxide such as MgO, CaO, SrO, TiO, VO, or NbO or others.

If a voltage or current is applied to the memory layers 121-1 and 121-2, the magnetization direction of the free layer may be changed by spin transfer torque. In some implementations, when the magnetization directions of the free layer and the pinned layer are parallel to each other, the memory layers 121-1 and 121-2 may be in a low resistance state, and this may indicate digital data bit "0." Conversely, when the magnetization directions of the free layer and the pinned layer are anti-parallel to each other, the memory layers 121-1 and 121-2 may be in a high resistance state, and this may indicate a digital data bit "1." In some implementations, the memory layers 121-1 and 121-2 can be configured to store data bit '1' when the magnetization directions of the free layer and the pinned layer are parallel to each other and to store data bit '0' when the magnetization directions of the free layer and the pinned layer are anti-parallel to each other.

In some implementations, the memory layers 121-1 and 121-2 may further include one or more layers performing various functions to improve a characteristic of the MTJ structure. For example, the memory layers 121-1 and 121-2 may further include at least one of a buffer layer, an under layer, a spacer layer, a magnetic correction layer and a capping layer.

In some implementations, the first memory layer 121-1 and the second memory layer 121-2 may have substantially the same height as each other.

In some implementations, the first memory layer 121-1 may partially and laterally overlap the second memory layer 121-2. Here, "laterally" may represent a direction parallel to a surface of a layer. Referring to the example as shown in FIG. 1, there exists a certain area between the first conductive lines and the second conductive lines where both of an upper portion of the first memory layer 121-1 and a lower portion of the second memory layer 121-2 are disposed. In some implementations, a bottom surface of the second memory layer 121-2 may be at a level lower than a top surface of the first memory layer 121-1 and higher than a bottom surface of the first memory layer 121-1, and a top surface of the second memory layer 121-2 may be at a level higher than the top surface of the first memory layer 121-1.

In some implementations, the first memory layer 121-1 and the second memory layer 121-2 may include the same material as each other.

The first memory layer 121-1 and the second memory layer 121-2 may be formed by different processes from each other. In some implementations, the first memory layer 121-1 may be formed by an etch process using a spacer patterning technology (SPT) and the second memory layer 121-2 may be formed by a damascene process in which a hole in a material layer for the selector layer 123-2 is filled. The formation of the first memory layer 121-1 and the second memory layer 121-2 will be described with reference to FIGS. 2A to 12B.

The selector layers 123-1 and 123-2 may serve to control access to the memory layers 121-1 and 121-2 by exhibiting different electrically conductive states at each selector layer and prevent a current leakage between the memory cells 120 sharing the first conductive line 110 or the second conductive line 130. For example, the selector layers 123-1 and 123-2 may have a threshold switching characteristic that blocks or substantially limits a current by using a low electrically conductive state of the selector layer (i.e., turning off the electrically conductive path through the selector layer) when a magnitude of an applied voltage to the selector layer is less than a predetermined threshold value and allows the current to increase rapidly by using a high electrically conductive state of the selector layer (i.e., turning on the electrically conductive path through the selector layer) when the magnitude of the applied voltage is equal to or greater than the predetermined threshold value. This threshold value may be referred to as a threshold voltage, and the selector layers 123-1 and 123-2 may controlled to be in either a turned-on or "on" state or high electrically conductive state to be electrically conductive or a turned-off or "off" state or low electrically conductive state to be electrically less-conductive than the "on" state or electrically non-conductive depending on whether the applied voltage is above or below the threshold voltage. Thus, the selector layers 123-1 and 123-2 exhibits different electrically conductive states to provide a switching operation to switch between the different electrically conductive states by controlling the applied voltage relative to the threshold voltage. The selector layers 123-1 and 123-2 may include Metal Insulator Transition (MIT) material such as NbO2, TiO2, VO2, WO2, or others, Mixed Ion-Electron Conducting (MIEC) material such as ZrO2 (Y2O3), Bi2P3-BaO, (La2O3)x(CeO2)1−x, or others, Ovonic Threshold Switching (OTS) material including chalcogenide material such as Ge2Sb2Te5, As2Te3, As2, As2Se3, or others, or a tunneling insulating material such as silicon oxide, silicon nitride, a metal oxide, or others. A thickness of the tunneling insulating layer is sufficiently small to allow tunneling of electrons through the tunneling insulating layer under a given voltage or a given current. The selector layers 123-1 and 123-2 may include a single-layered structure or a multi-layered structure.

In some implementations, the selector layers 123-1 and 123-2 may include a dielectric material having incorporated dopants. The selector layers 123-1 and 123-2 may include an oxide with dopants, a nitride with dopants, or an oxynitride with dopants, or a combination thereof such as silicon oxide, titanium oxide, aluminum oxide, tungsten oxide, hafnium oxide, tantalum oxide, niobium oxide, silicon nitride, titanium nitride, aluminum nitride, tungsten nitride, hafnium nitride, tantalum nitride, niobium nitride, silicon oxynitride, titanium oxynitride, aluminum oxynitride, tungsten oxynitride, hafnium oxynitride, tantalum oxynitride, or niobium oxynitride, or a combination thereof. The dopants doped into the selector layers 123-1 and 123-2 may include an n-type dopant or a p-type dopant and be incorporated by suitable techniques, for example, an ion implantation process. Examples of the dopants may include one or more of boron (B), nitrogen (N), carbon (C), phosphorous (P), arsenic (As), aluminum (Al), silicon (Si) or germanium (Ge). For example, the selector layer 123-1 and 123-2 may include As-doped silicon oxide or Ge-doped silicon oxide.

In some implementations, the selector layers 123-1 and 123-2 may perform a threshold switching operation through a doped region formed in a material layer for the selector layers 123-1 and 123-2. Thus, a size of the threshold switching operation region may be controlled by a distribution area of the dopants. The dopants may form trap sites for charge carriers in the material layer for the selector layers 123-1 and 123-2. The trap sites may capture the charge carriers moving in the selector layers 123-1 and 123-2 based on an external voltage applied to the selector layers 123-1 and 123-2. The trap sites thereby provide a threshold switching characteristic and are used to perform a threshold switching operation.

The first selector layer 123-1 may be disposed between the first memory layer 121-1 and the second conductive lines 130 and the second selector layer 123-2 may be disposed between the first conductive lines 110 and the second memory layer 121-2.

In some implementations, the first selector layer 123-1 and the second selector layer 123-2 may have substantially the same height as each other.

In some implementations, the first selector layer 123-1 may not laterally overlap the second selector layer 123-2. Here, "laterally" may represent a direction parallel to a surface of a layer. Thus, a bottom surface and a top surface of the second selector layer 123-2 may be at a level lower than a bottom surface of the first selector layer 123-1.

In some implementations, the first selector layer 123-1 may laterally overlap the second memory layer 121-2 in a direction parallel to a surface of a layer. Thus, the bottom surface of the first selector layer 123-1 may be at a level higher than the bottom surface of the second memory layer 121-2 and lower than the top surface of the second memory layer 121-2, and a top surface of the first selector layer 123-1 may be at substantially the same level as the top surface of the second memory layer 121-2.

In some implementations, the second selector layer 123-2 may laterally overlap the first memory layer 121-1 in a direction in a direction parallel to a surface of a layer. The top surface of the second selector layer 123-2 may be at a level lower than the top surface of the first memory layer 121-1 and higher than the bottom surface of the first memory layer 121-1, and the bottom surface of second selector layer 123-2 may be at substantially the same level as the bottom surface of the first memory layer 121-1.

In some implementations, the first selector layer 123-1 and the second selector layer 213-2 may include the same material as each other.

Spaces between the first conductive lines 110, the second conductive lines 130, the first memory cell 120-1 and the second memory cell 120-2 may be filled with an insulating layer 123B. The insulating layer 123B may include the same material as the selector layers 123-1 and 123-2. In some implementations, the insulating layer 123B may include an insulating material doped with a dopant.

In some implementations, the memory cell 120 includes the first memory cell 121-1 in which the first memory layer 121-1 and the first selector layer 123-1 are sequentially stacked and the second memory cell 121-2 in which the second selector layer 123-2 and the second memory layer 121-2 are sequentially stacked. The structures of the memory cells 120 may be varied without being limited to one as shown in FIG. 1 as long as the memory cells 120 have data storage properties. In some implementations, the memory cells 120 may further include one or more layers (not shown) for enhancing characteristics of the memory cells 120 or improving fabricating processes.

In some implementations, neighboring memory cells of the plurality of memory cells 120 may be spaced apart from each other at a predetermined interval, and trenches may be present between the plurality of memory cells 120. A trench between neighboring memory cells 120 may have a height to width ratio (i.e., an aspect ratio) in a range from 1:1 to 40:1, from 10:1 to 40:1, from 10:1 to 20:1, from 5:1 to 10:1, from 10:1 to 15:1, from 1:1 to 25:1, from 1:1 to 30:1, from 1:1 to 35:1, or from 1:1 to 45:1.

In some implementations, the trench may have sidewalls that are substantially perpendicular to an upper surface of the substrate 100. In some implementations, neighboring trenches may be spaced apart from each other by an equal or similar distance.

Although one cross-point structure has been described, two or more cross-point structures may be stacked in a vertical direction that is perpendicular to a top surface of the substrate 100.

An example method for fabricating a semiconductor device based on some implementations of the disclosed technology is described with reference to FIGS. 2A to 12B. The detailed descriptions similar to those described in FIG. 1 will be omitted. FIGS. 2A, 3A, 4A, 5A, 6A, 7A, 8A, 9A, 10A, 11A and 12A are top views, and FIGS. 2B, 3B, 4B, 5B, 6B, 7B, 8B, 9B, 10B, 11B and 12B are cross-sectional views taken along line X-X' of FIGS. 2A, 3A, 4A, 5A, 6A, 7A, 8A, 9A, 10A, 11A and 12A, respectively. Line X-X' is a line parallel to a second direction in which second conductive lines 130 extend.

Figure 2A:
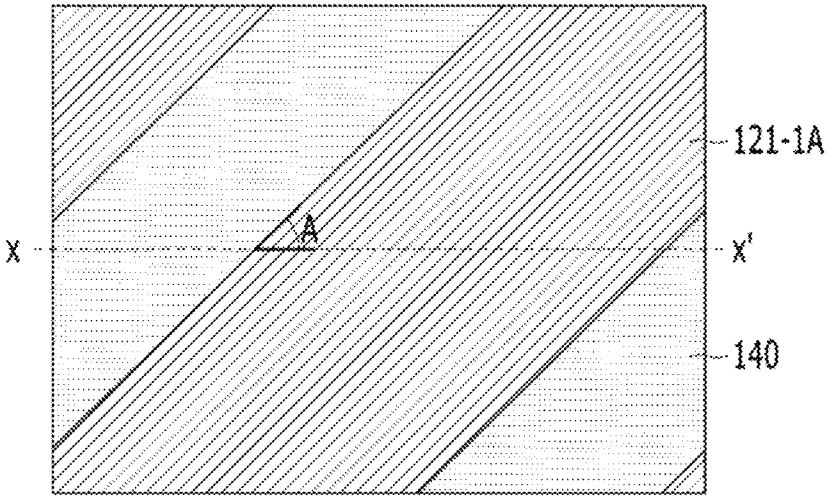
FIGS. 2A to 12B are cross-sectional views illustrating an example method for fabricating a semiconductor device based on some implementations of the disclosed technology.
Figure 2B:
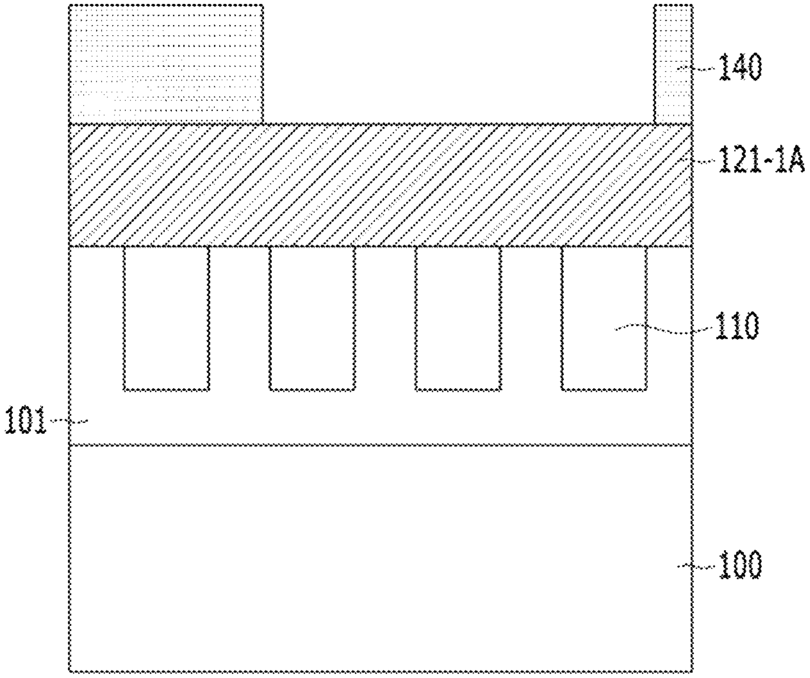

Referring to FIGS. 2A and 2B, first conductive lines 110 may be formed over a substrate 100. The first conductive lines 110 may be formed over the substrate 100 by forming an interlayer dielectric layer 101 having a trench for forming the first conductive lines 110, forming a conductive layer for the first conductive lines 110 in the trench and etching the conductive layer using a mask pattern in a line shape extending in a first direction.

A material layer 121-1A for a first memory layer may be formed over the first conductive lines 110 and the interlayer dielectric layer 101.

The material layer 121-1A may be a layer to be etched using a subsequent spacer patterning process and used to form a first memory layer 121-1.

The material layer 121-1A include materials having a variable resistance characteristic used for an RRAM, a PRAM, an MRAM, an FRAM, and others. With the variable resistance characteristics, the material layer 121-1A may have different resistance states according to an applied voltage or current.

A first partition layer 140 may be formed over the material layer 121-1A. The first partition layer 140 may be formed by forming a material layer for forming the first partition layer 140 over the material layer 121-1A and etching the material layer for forming the first partition layer 140 using a mask pattern.

The first partition layer 140 may include an insulating material. For example, the first partition layer 140 may include an oxide, or a nitride, or a combination thereof.

The first partition layer 140 may be formed to have a predetermined angle with respect to the first direction and the second direction. The second direction is different from the first direction and crosses the first direction. In some implementations, the first partition layer 140 may have a line shape extending in a direction (also referred to as a third direction) having a predetermined angle with respect to the first direction and the second direction. The first partition layer 140 may have a predetermined tilted angle A that is tilted with respect to the second direction. The tilted angle A of the first partition layer 140 may be greater than 0° and less than 90°. Thus, the angle A between the first partition layer 140 and the second direction may be greater than 0° and less than 90°.

In some implementations, the first partition layer 140 may have an angle of about 45° with respect to the second direction.

A spacing between adjacent first partition layers of the first partition layers 140 may be substantially $\sqrt{2}$ times wider than a spacing between adjacent first conductive lines of the first conductive lines 110. Here, the spacing may be expressed as a distance from one end of a pattern to the other end of an adjacent identical pattern. In some implementations, since the spacing between the patterns may be proportional to a pitch between the patterns, the pitch of the adjacent first partition layers 140 may be substantially $\sqrt{2}$ times wider than a pitch between the adjacent first conductive lines 110. Here, the pitch may be expressed as a center-to-center distance between the adjacent patterns.

In this way, by forming the wider spacing between the adjacent first partition layers 140, it is possible to significantly increase a process margin in subsequent processes. Accordingly, the process efficiency can be further improved by reducing the process difficulty and the need for fine control due to the narrow spacing.

A width of the first partition layer 140 may be ½ of the pitch. When the pitch of the first conductive lines 110 is "a", the width of the first partition layer 140 may be $\sqrt{2}a/2$. At this time, the width of the first partition layer 140 may be adjusted by about ±20% depending on a mask process.

Figure 3A:
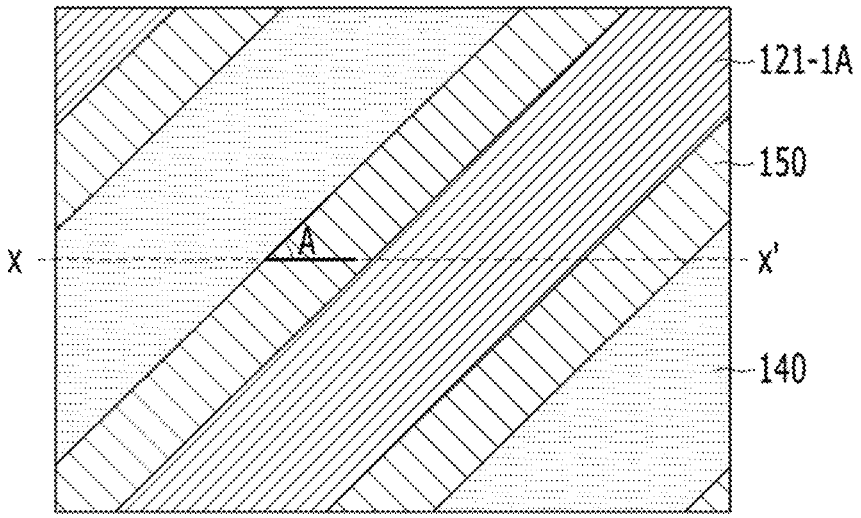
Figure 3B:
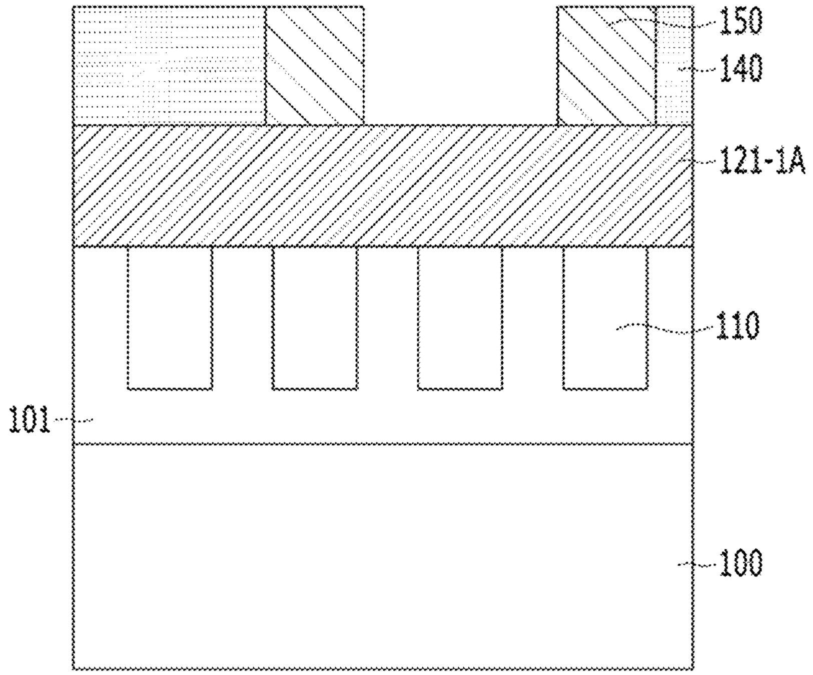

Referring to FIGS. 3A and 3B, a first spacer layer 150 may be formed on sidewalls of the first partition layer 140.

The first spacer layer 150 may be formed by depositing a material layer for forming the first spacer layer 150 along the entire surfaces of the first partition layer 140 and the material layer 121-1A and etching the material layer for forming the first spacer layer 150 in such a way that the first pacer layer 150 is disposed on the sidewalls of the first partition layer 140 and a top surface of the first partition layer 140 is substantially exposed. At this time, a horizontal width of the first spacer layer 150 may be controlled by controlling a thickness of the material layer for forming the first spacer layer 150.

In some implementations, the first spacer layer 150 may include a material having an etch selectivity with respect to a material included in the first partition layer 140. In some implementations, the first spacer layer 150 may include different materials from the first partition layer 140. In some implementations, the first spacer layer 150 may include an insulating material. In some implementations, the first spacer layer 150 may include a silicon element such as silicon oxide, silicon nitride, silicon oxynitride, or polysilicon. In some implementations, the first spacer layer 150 may include amorphous carbon. For example, when the first partition layer 140 includes silicon nitride, the first spacer layer 150 may include silicon oxide having an etch selectivity with respect to the silicon nitride.

The first spacer layer 150 may be formed to have a predetermined angle with respect to the first direction and the second direction. Thus, the first spacer layer 150 may be in a line shape extending in a direction (i.e., the third direction) having a predetermined angle with respect to the first direction and the second direction. The first spacer layer 150 may have the same tilted angle as the tilted angle of the first partition layer 140 with respect to the second direction. In some implementations, an angel A between the first spacer layer 150 and the second direction may be greater than 0° and less than 90°. In some implementations, the first spacer layer 150 may have an angle of about 45° with respect to the second direction.

Figure 4A:
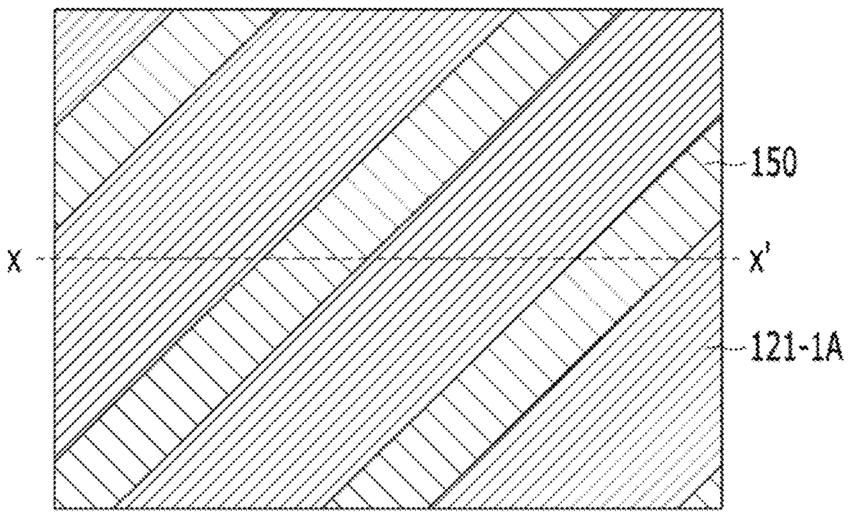
Figure 4B:
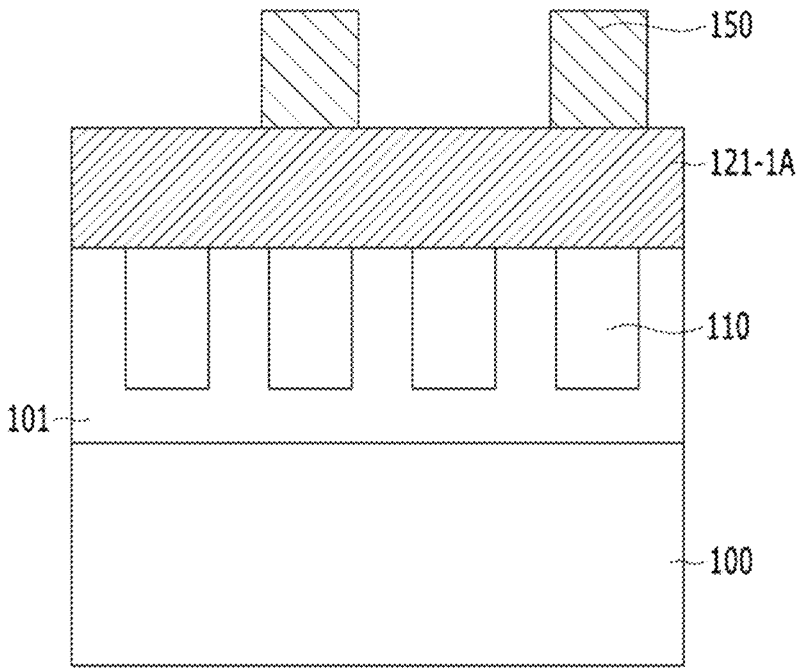

Referring to FIGS. 4A and 4B, the first partition layer 140 may be removed after forming the first spacer layer 150.

The first partition layer 140 may be removed by a method including a strip process or an ashing process.

Figure 5A:
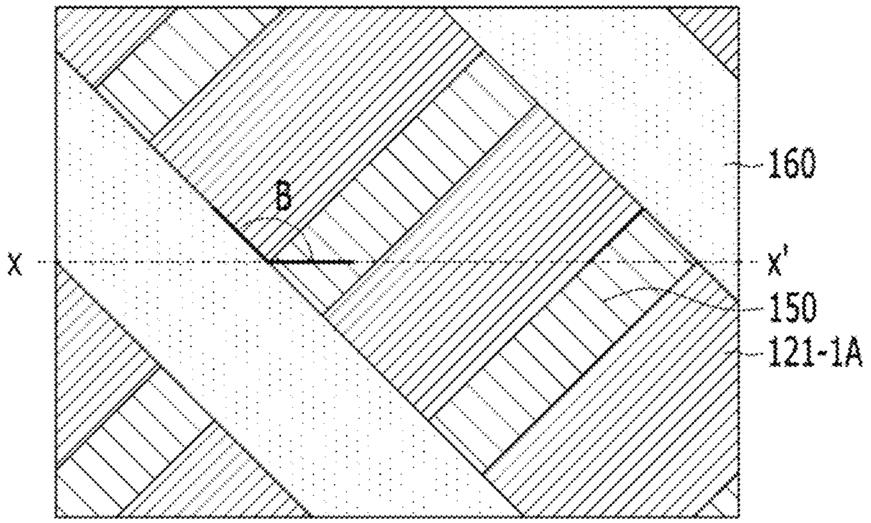
Figure 5B:
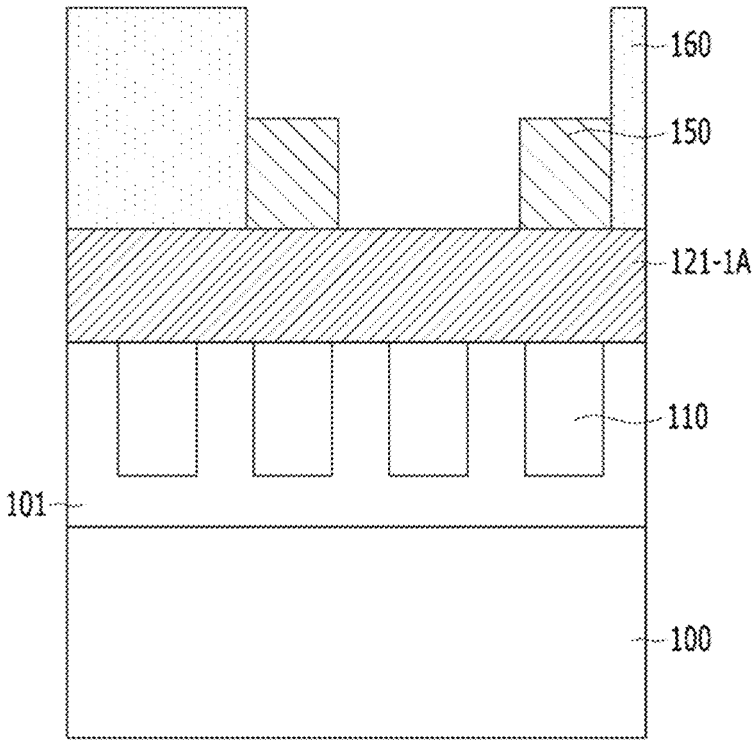

Referring to FIGS. 5A and 5B, a second partition layer 160 may be formed over the structure of FIGS. 4A and 4B.

The second partition layer 160 may be formed by forming a material layer for forming the second partition layer 160 and etching the material layer using a mask pattern.

The second partition layer 160 may include an insulating material. In some implementations, the second partition layer 160 may include an oxide, or a nitride, or a combination thereof.

In some implementations, the second partition layer 160 and the first partition layer 140 may include the same material as each other.

In some implementations, the second partition layer 160 and the first partition layer 140 may include different materials from each other.

The second partition layer 160 may be formed to have a predetermined angle with respect to the first direction and the second direction. Thus, the second partition layer 160 may have a line shape extending in a direction (also referred to as a fourth direction) having a predetermined angle with respect to the first direction and the second direction. With respect to the second direction, the second partition layer 160 may have a predetermined tilted angle B. The tilted angle B of the second partition layer 160 may be greater than 90° and less than 180°. Thus, the angle B between the second partition layer 160 and the second direction may be greater than 90° and less than 180°.

In some implementations, the second partition layer 160 may have a line shape extending in a direction (i.e., the fourth direction) crossing the third direction in which the first partition layer 140 extends.

In some implementations, the second partition layer 160 may have an angle of about 90° with respect to the first partition layer 140.

In some implementations, the second partition layer 160 may have an angle of about 135° with respect to the second direction.

A spacing between adjacent second partition layers of the second partition layers 160 may be substantially √2 times wider than a spacing between adjacent first conductive lines of the first conductive lines 110. In some implementations, a spacing between the patterns may be proportional to a pitch between the patterns, the pitch of the adjacent second partition layers 160 may be substantially √2 times wider than a pitch between the adjacent first conductive lines 110.

As such, by forming the wider spacing between the adjacent second partition layers 160, it is possible to significantly increase a process margin in subsequent processes. Accordingly, the process efficiency can be further improved by reducing the process difficulty and the need for fine control due to the narrow spacing.

A width of the second partition layer 160 may be ½ of the pitch. When the pitch of the first conductive lines 110 is "a", the width of the second partition layer 160 may be √2a/2. At this time, the width of the second partition layer 160 may be adjusted by about ±20% depending on a mask process.

Figure 6A:
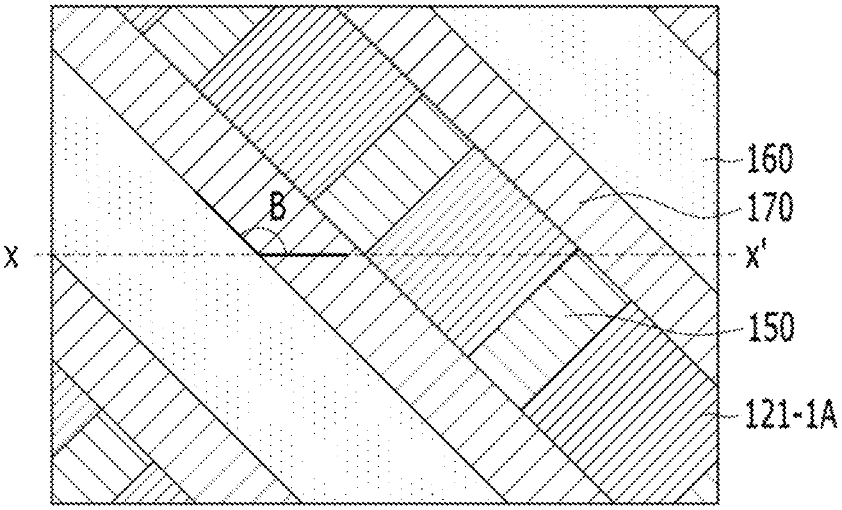
Figure 6B:
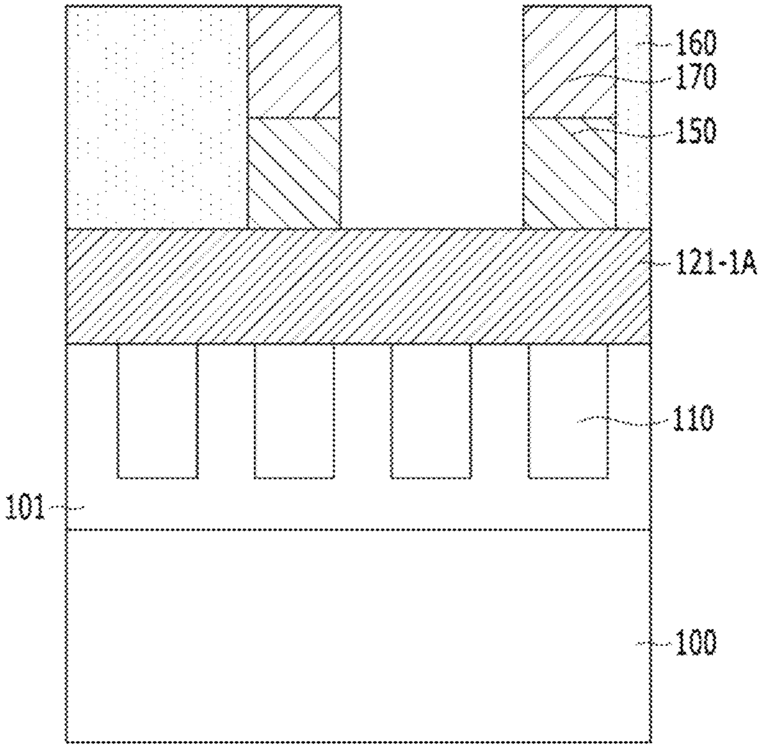

Referring to FIGS. 6A and 6B, a second spacer layer 170 may be formed on sidewalls of the second partition layer 160.

The second spacer layer 170 may be formed by depositing a material layer for forming the second spacer layer 170 along the entire surfaces of the second partition layer 160, the first spacer layer 150 and the material layer 121-1A and etching the material layer for forming the second spacer layer 170 in such a way that the second spacer layer 170 is disposed on the sidewalls of the second partition layer 160 and a top surface of the second partition layer 160 is substantially exposed. At this time, a horizontal width of the second spacer layer 170 may be controlled by controlling a thickness of the material layer for forming the second spacer layer 170.

In some implementations, the second spacer layer 170 may include a material having an etch selectivity with respect to a material included in the second partition layer 160. In some implementations, the second spacer layer 170 may include different materials from the second partition layer 160. In some implementations, second spacer layer 170 may include an insulating material. In some implementations, the second spacer layer 170 may include a silicon element such as silicon oxide, silicon nitride, silicon oxynitride, or polysilicon. In some implementations, the second spacer layer 170 may include amorphous carbon. For example, when the second partition layer 160 includes silicon nitride, the second spacer layer 170 may include silicon oxide having an etch selectivity with respect to the silicon nitride.

In some implementations, the second spacer layer 170 and the first spacer layer 150 may include the same material as each other.

The second spacer layer 170 may be formed to have a predetermined angle with respect to the first direction and the second direction. Thus, the second spacer layer 170 may be in a line shape extending in a direction (i.e., the fourth direction) having a predetermined angle with respect to the first direction and the second direction. The second spacer layer 170 may have the same tilted angle B as the tilted angle of the second partition layer 160 with respect to the second direction. In some implementations, an angle B between the second spacer layer 170 and the second direction may be greater than 90° and less than 180°. In some implementations, the second spacer layer 170 may have an angle of about 135° with respect to the second direction.

In some implementations, the second spacer layer 170 may have a line shape extending in the fourth direction crossing the third direction in which the first spacer layer 150 extends.

In some implementations, the second spacer layer 170 may have an angle of about 90° with respect to the first spacer layer 150.

Figure 7A:
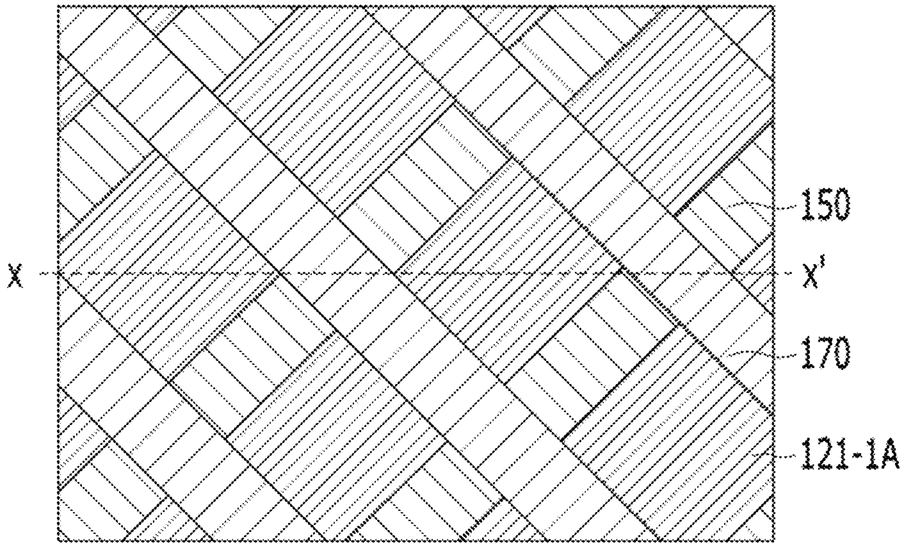
Figure 7B:
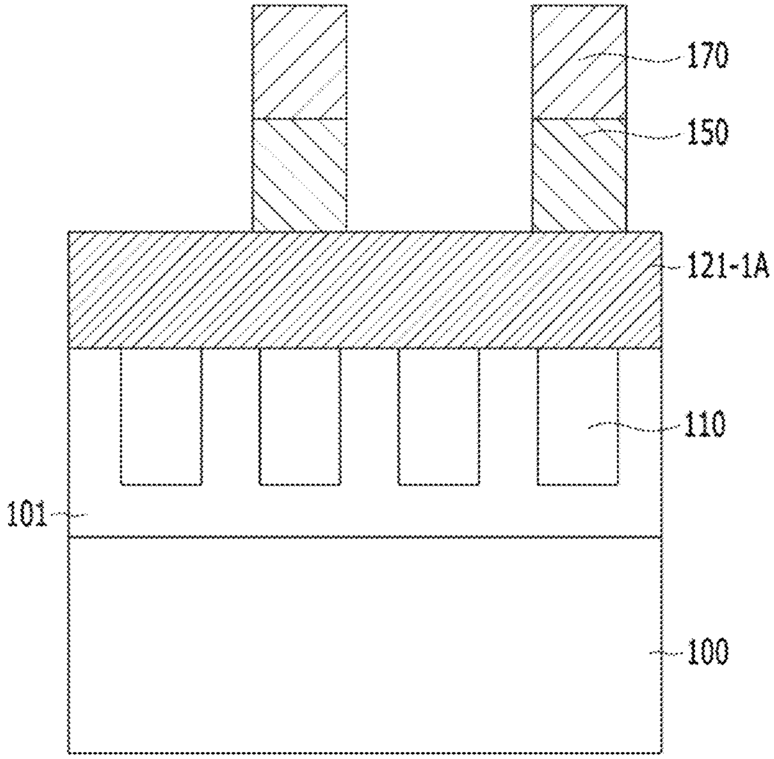

Referring to FIGS. 7A and 7B, the second partition layer 160 may be removed after forming the second spacer layer 170.

The second partition layer 160 may be removed by a method including a strip process or an ashing process.

Through the above processes, the first spacer layer 150 having a line shape extending in the third direction and the second spacer layer 170 having a line shape extending in the fourth direction may be formed over the material layer 121-1A over first conductive lines 110. The first spacer layer 150 and the second spacer layer 170 may have a predetermined angle with respect to the first direction and the second direction. At an intersection region between the first spacer layer 150 and the second spacer layer 170, a structure in which the first spacer layer 150 and the second spacer layer 170 are sequentially stacked may be formed.

The stacked structure of the first spacer layer 150 and the second spacer layer 170 may be referred to as a spacer pattern. The spacer pattern may be formed in such a way that a spacing between adjacent spacer patterns along the third direction and the fourth direction is substantially √2 times wider than the spacing between the adjacent first conductive lines 110.

Figure 8A:
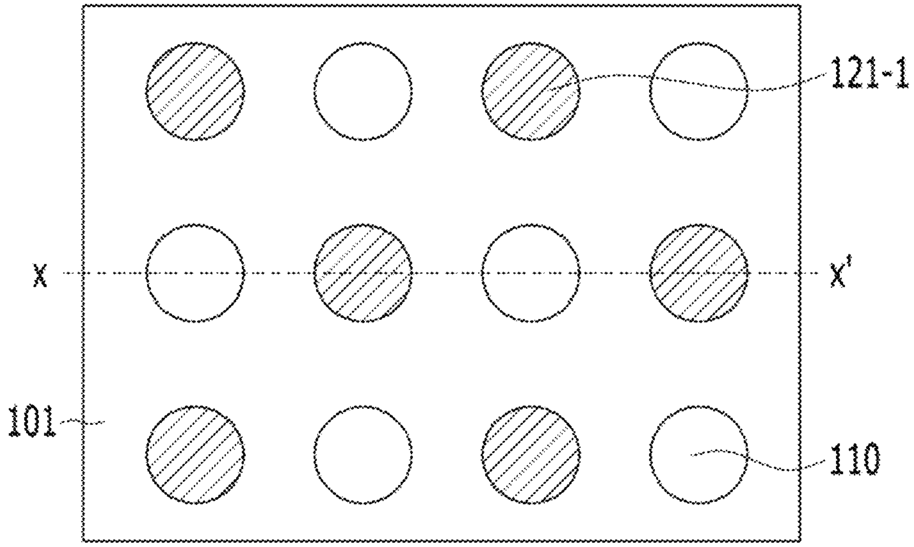
Figure 8B:
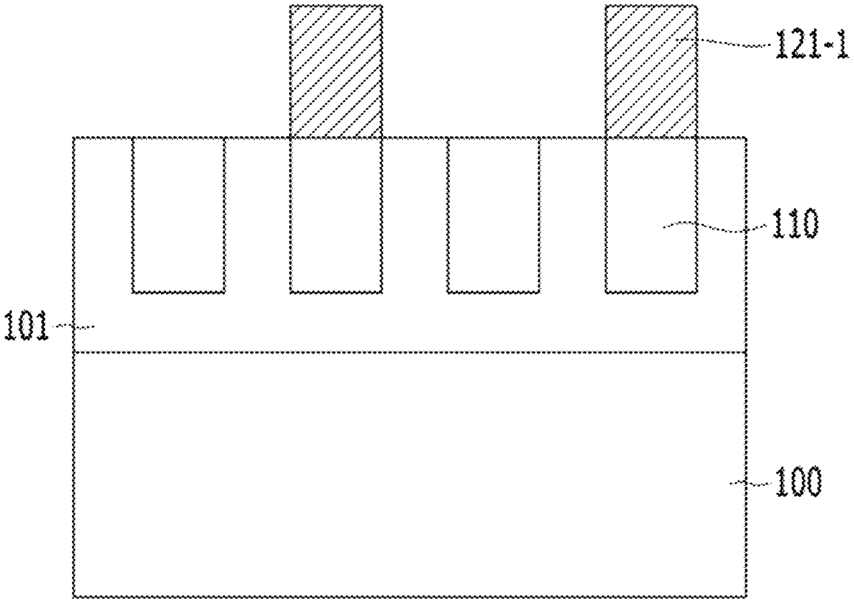

Referring to FIGS. 8A and 8B, the first memory layer 121-1 may be formed by etching the material layer 121-1A using the spacer pattern including the second spacer layer 170 and the first spacer layer 150 as an etch barrier.

The etching process may be performed by an ion beam etch (IBE) process, or a reactive ion etch process (RIE), or a combination thereof.

In some implementations, the etch process for forming the first memory layer 121-1 may be performed using the first spacer layer 150 and the second spacer layer 170 which are formed by two rounds of a spacer patterning process. In this case, since the spacing between the adjacent first spacer layers 150 and the spacing between the adjacent second spacer layers 170 may be formed to be wider than the conventional technology, the process margin can be significantly increased. Accordingly, it is possible to reduce the process difficulty and the need for fine control due to the narrow spacing, thereby further increasing the process efficiency.

The first memory layer 121-1 may be formed over the first conductive lines 110. A spacing between adjacent first memory layers of the first memory layers 121-1 along the third direction and the fourth direction may be substantially √2 times wider than the spacing between adjacent first conductive lines of the first conductive lines 110. Through the above processes, the first memory layer 121-1 may be formed over half of the first conductive lines 110 and top surfaces of the remaining half of the first conductive lines 110 on which the first memory layer 121-1 is not formed may be exposed. As a result, as shown in FIG. 8A, each of the first conductive lines 110 and each of the first memory layers 121-1 may be disposed adjacent to each other along the first direction and the second direction.

Figure 9A:
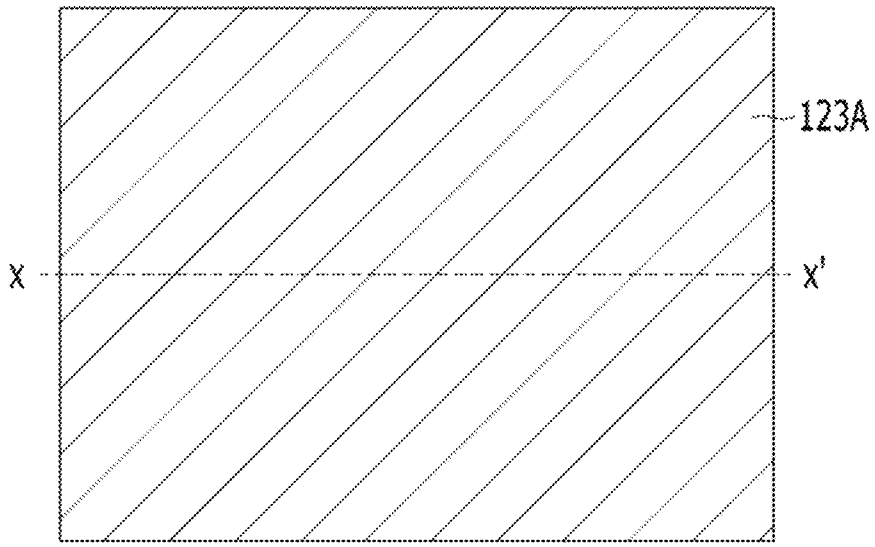
Figure 9B:
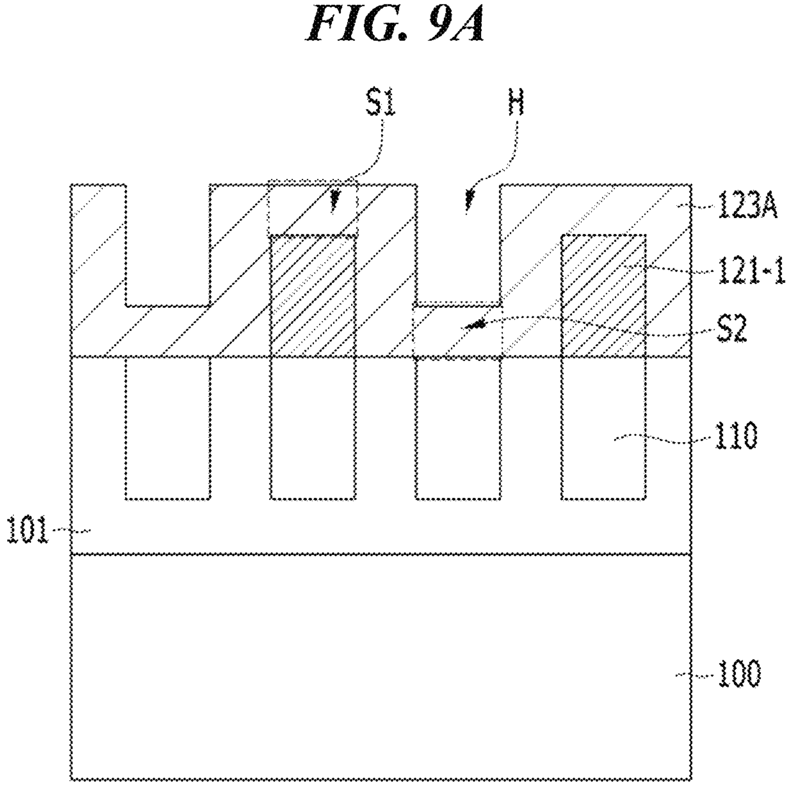

Referring to FIGS. 9A and 9B, a material layer 123A for a selector layer may be formed over the structure of FIGS. 8A and 8B.

The material layer 123A may be conformally formed over the structure of FIGS. 8A and 8B. Thus, the material layer 123A may be formed to cover the top surface and the side surfaces of the first memory layer 121-1 and form a hole H disposed between adjacent first memory layers 121-1 to be spaced apart from the top surface of the first conductive lines 110.

The hole H may be a portion in which a material layer 121-2A for a second memory layer is to be filled to form a second memory layer 121-2. A spacing between the adjacent holes H along the third direction and the fourth direction may be substantially √2 times wider than the spacing between the adjacent first conductive lines 110.

In some implementations, the material layer 123A may include a dielectric material having incorporated dopants. The material layer 123A may include an oxide with dopants, a nitride with dopants, or an oxynitride with dopants, or a combination thereof. Examples of the dopants may include one or more of boron (B), nitrogen (N), carbon (C), phosphorous (P), arsenic (As), aluminum (Al), silicon (Si) or germanium (Ge).

In some implementations, the material layer 123A may be formed by conformally forming a dielectric material over the structure of FIGS. 8A and 8B and incorporating a dopant into the dielectric material by an ion implantation process.

The size of the hole H may be adjusted by adjusting a thickness of the material layer 123A when forming the material layer 123A. Therefore, the size of the hole may be appropriately adjusted to correspond to the second memory layer 121-2 by adjusting the thickness of the material layer 123A.

In the material layer 123A, a portion S1 disposed over the first memory layer 121-1 may represent a portion to be formed as a first selector layer 123-1 in a subsequent process and a portion S2 disposed over the first conductive lines 110 and under the hole H may represent a portion to be formed as a second selector layer 123-2 in a subsequent process. After a subsequent process for forming the second memory layer 121-2, remaining portions of the material layer 123A except for the selector layers 123-1 and 123-2 may be expressed as an insulating layer 123B.

Figure 10A:
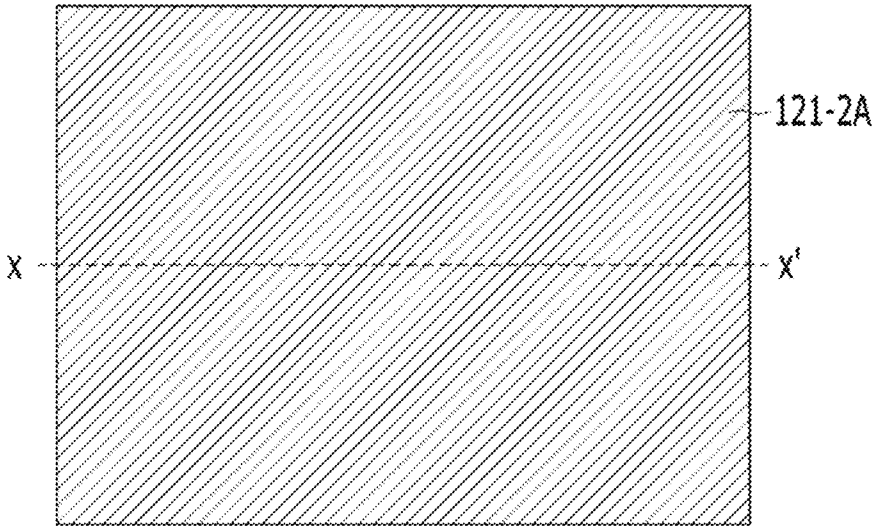
Figure 10B:
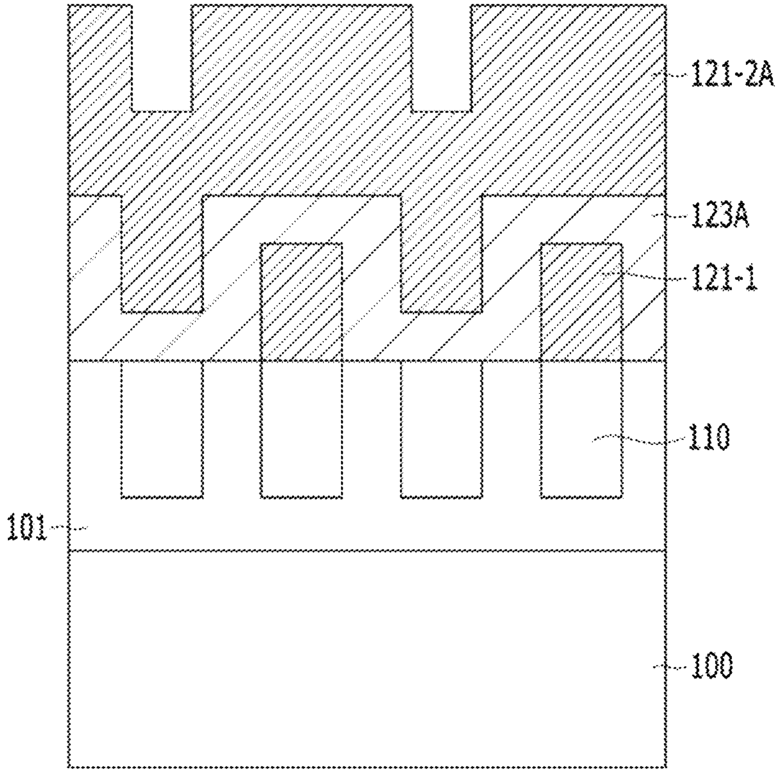

Referring to FIGS. 10A and 10B, a material layer 121-2A for the second memory layer may be conformally formed over the structure of FIGS. 9A and 9B. Thus, the material layer 121-2A may be formed to cover the material layer 123A and fill the hole H.

The material layer 121-2A buried in the hole H may represent a portion to be formed as the second memory layer 121-2 in a subsequent process.

The material layer 121-2A may include the same material as the material layer 121-1A.

Figure 11A:
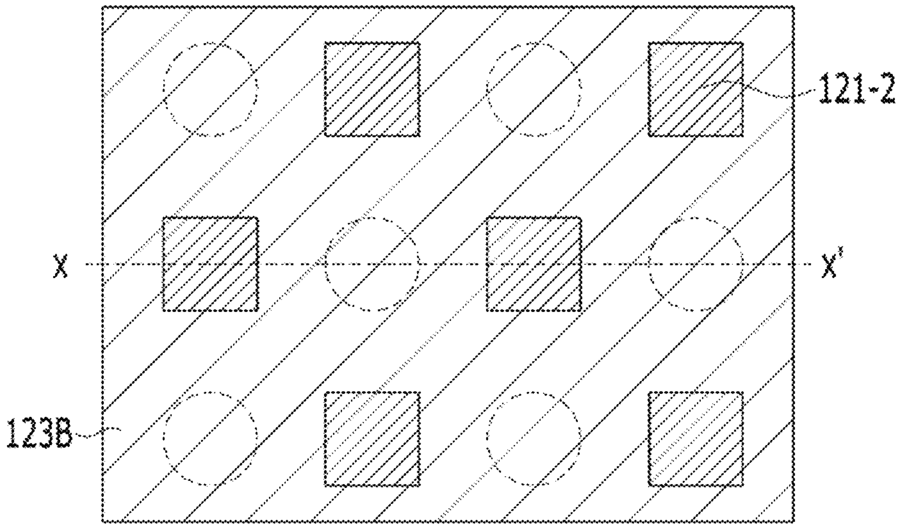
Figure 11B:
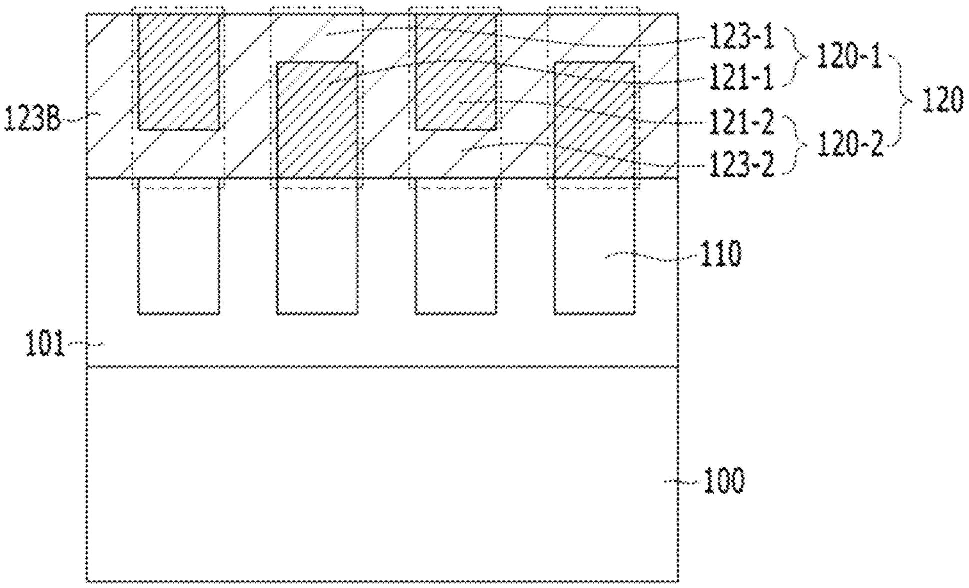

Referring to FIGS. 11A and 11B, a planarization process such as a chemical mechanical planarization (CMP) may be performed until the material layer 121-2A buried in the hole is exposed.

Through the planarization process, the material layer 121-2A buried in the hole H may be separated to form the second memory layer 121-2.

In some implementations, unlike the first memory layer 121-1 formed by the etch process using the first spacer layer 150 and the second spacer layer 170, the second memory layer 121-2 may be formed by a damascene process in which the hole H is gapfilled with the material layer 121-2A.

As described above, after forming the second memory layer 121-2, the portion S1 in the material layer 123A disposed over the first memory layer 121-1 and the portion S2 in the material layer 123A under the second memory layer 121-2 may be expressed as the first selector layer 123-1 and the second selector layer 123-2, respectively. Remaining portion of the material layer 123A except for the selector layers 123-1 and 123-2 may be expressed as the insulating layer 1238.

Through the above-described process, the first memory cell 120-1 including the first memory layer 121-1 and the first selector layer 123-1 which are sequentially stacked and the second memory cell 120-2 including the second selector layer 123-2 and the second memory layer 121-2 which are sequentially stacked may be formed.

The first memory cell 120-1 and the second memory cell 120-2 may be formed adjacent to each other along the first direction and the second direction. Thus, the first memory cell 120-1 and the second memory cell 120-2 may be alternately disposed along the first direction and the second direction. A portion indicated by a dotted line in FIG. 11A may represent the memory cell 120-1 in which the first memory layer 121-1 and the first selector layer 123-1 are stacked.

A spacing between adjacent second memory layers of the second memory layers 121-2 along the third direction and the fourth direction may be v2 times wider than a spacing between the adjacent first conductive lines 110. A spacing between adjacent first selector layers of the first selector layers 123-1 along the third direction and the fourth direction may be v2 times wider than the spacing between the adjacent first conductive lines 110.

Figure 12A:
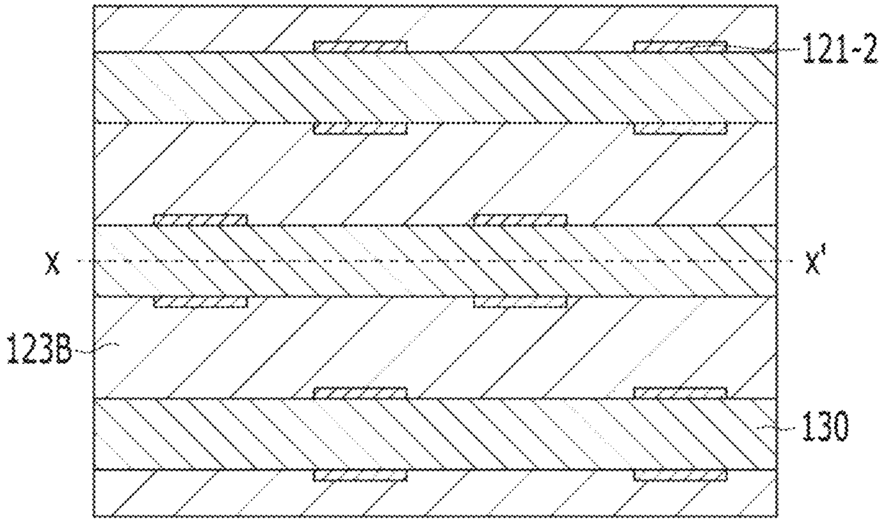
Figure 12B:
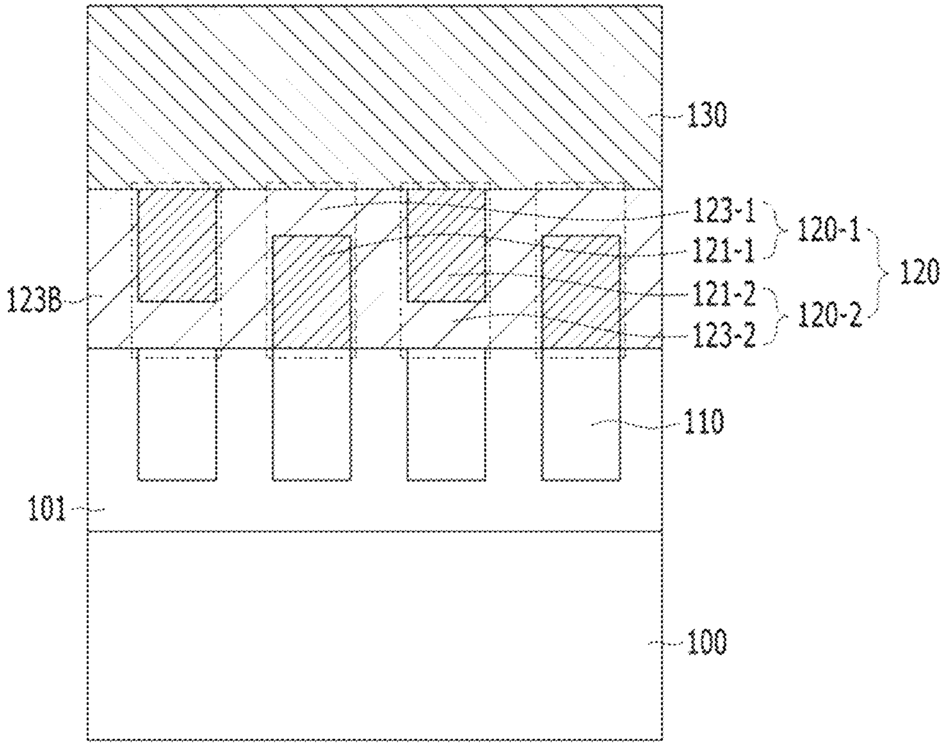

Referring to FIGS. 12A and 12B, second conductive lines 130 may be formed over the structure of FIGS. 11A and 11B.

The second conductive lines 130 may be formed by forming an insulating layer having a trench for forming the second conductive lines 130, depositing a conductive layer in the trench and etching the conductive layer using a mask pattern (not shown) extending in the second direction.

Through the method described above, the semiconductor device including the substrate 100, the first conductive lines 110, the second conductive lines 130 and the memory cell 120 may be formed. The memory cell 120 may include the first memory cell 120-1 and the second memory cell 120-2 which are disposed adjacent to each other along the first direction and the second direction. The first memory cell 120-1 may include a structure in which the first memory layer 121-1 and the first selector layer 123-1 are sequentially stacked and the second memory cell 120-2 may include a structure in which the second selector layer 123-2 and the second memory layer 121-2 are sequentially stacked. The relative position of the first memory layer 121-1 and the first selector layer 123-1 and the relative position of the second memory layer 121-2 and the second selector layer 123-2 may be reversed. Thus, the first memory layer 121-1 may be disposed at a lower portion of the first memory cell 120-1 and the first selector layer 123-1 may be disposed at an upper portion of the first memory cell 120-1, while the second memory layer 121-2 may be disposed at an upper portion of the second memory cell 120-2 and the second selector layer 123-2 may be disposed at a lower portion of the second memory cell 120-2.

In some implementations, the first memory layer 121-1 may be formed by an etch process using first spacer layer 150 and the second spacer layer 170 which are formed by an SPT and the second memory layer 121-2 may be formed by a damascene process in which the material layer 121-2A is gapfilled in the hole H. In this case, although the deposition process of the material layer is performed twice for forming the memory layers 121-1 and 121-2 on the first memory layer 121-1 and the second memory layer 121-2, respectively, the etch process may be performed only once on the first memory layer 121-1 at a wider spacing than that in the conventional process. Accordingly, the process margin can be remarkably increased at a similar process cost, and the process difficulty and the need for fine control can be reduced.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few embodiments and examples are described. Enhancements and variations of the disclosed embodiments and other embodiments can be made based on what is described and illustrated in this patent document.

What is claimed is:

1. A method for fabricating a semiconductor device comprising:
- forming first conductive lines extending in a first direction over a substrate;
- forming a first memory layer over the first conductive lines;
- forming, over the first memory layer, a first spacer layer extending in a third direction having a first angle tilted with respect to a second direction crossing the first direction;
- forming, over the first spacer layer, a second spacer layer extending in a fourth direction crossing the third direction;
- etching the first memory layer using a spacer pattern including a stacked structure of the first spacer layer and the second spacer layer as an etch barrier to form a first memory layer pattern over a first portion of each of the first conductive lines;
- conformally forming a selector layer to cover a top surface and sidewalls of the first memory layer pattern and have a hole disposed between adjacent first memory layers to be spaced apart from a top surface of a second portion of each of the first conductive lines;
- filling the hole with a second memory layer to form a second memory layer pattern; and
- forming second conductive lines extending in the second direction over the second memory layer pattern.

2. The method according to claim 1, wherein the forming of the first spacer layer and the forming of the second spacer layer comprise:
- forming, over the first memory layer, first partition layers at a spacing that is √2 times wider than a spacing between adjacent first conductive lines, each of the first partition layers having a first angle of about 45° that is tilted with respect to the second direction;
- forming a first spacer layer on sidewalls of each of the first partition layers;
- removing the first partition layers;
- forming, over the first spacer layer, second partition layers at a spacing that is √2 times wider than a spacing between adjacent first conductive lines, each of the second partition layers having a second tilted angle of about 135° with respect to the second direction;
- forming a second spacer layer on sidewalls of each of the second partition layers; and
- removing the second partition layers.

3. The method according to claim 2, wherein the first partition layer and the first spacer layers include a same material as each other.

4. The method according to claim 2, wherein the second partition layer and the second spacer layers include different materials from each other.

5. The method according to claim 1, wherein a spacing between adjacent spacer patterns is √2 times wider than a spacing between adjacent first conductive lines.

6. The method according to claim 1, wherein the forming of the second memory layer pattern further includes performing a planarization process on the second memory layer filled in the hole.

7. The method according to claim 1, wherein the conformally forming of the selector layer comprises:
- forming an insulating material layer; and
- incorporating a dopant into the insulating material layer by an ion implantation process.

8. The method according to claim 1, wherein a spacing between adjacent first memory layer patterns along the third direction and the fourth direction and a spacing between adjacent second memory layer patterns along the third direction and the fourth direction is √2 time wider than a spacing between adjacent first conductive lines.

9. The method according to claim 1, wherein the first memory layer and the second memory layer include a same material as each other.

10. The method according to claim 1, wherein a bottom surface of the second memory layer is disposed at a level lower than a top surface of the first memory layer and higher than a bottom surface of the first memory layer, and a top surface of the second memory layer is disposed at a level higher than the top surface of the first memory layer.

11. The method according to claim 1, further comprising:
- forming a first selector layer pattern and a second selector layer pattern by converting the selector layer disposed over the first memory layer pattern and the selector layer disposed under the second memory layer pattern, and
- wherein a top surface and a bottom surface of the second selector layer pattern are disposed at level lower than a bottom surface of the first selector layer pattern.

* * * * *